United States Patent
Kim et al.

(10) Patent No.: US 11,588,129 B2
(45) Date of Patent: Feb. 21, 2023

(54) ORGANIC LIGHT-EMITTING DIODE DISPLAY DEVICE AND MANUFACTURING METHOD THEREOF

(71) Applicant: DB HiTek Co., Ltd., Bucheon-si (KR)

(72) Inventors: Young-Jin Kim, Seoul (KR); Dae-Il Kim, Cheongju-si (KR); Dong-Hoon Park, Uiwang-si (KR); Hye-Rim Eun, Daegu (KR)

(73) Assignee: DB HiTek, Co., Ltd., Bucheon-si (KR)

( * ) Notice: Subject to any disclaimer, the term of this patent is extended or adjusted under 35 U.S.C. 154(b) by 144 days.

(21) Appl. No.: 17/185,707

(22) Filed: Feb. 25, 2021

(65) Prior Publication Data

US 2021/0280815 A1    Sep. 9, 2021

(30) Foreign Application Priority Data

Mar. 4, 2020    (KR) .................. 10-2020-0026950

(51) Int. Cl.
*H01L 51/52*    (2006.01)
*H01L 51/56*    (2006.01)
*H01L 27/32*    (2006.01)

(52) U.S. Cl.
CPC .......... *H01L 51/5218* (2013.01); *H01L 51/56* (2013.01); *H01L 27/322* (2013.01); *H01L 27/3206* (2013.01); *H01L 27/3258* (2013.01); *H01L 51/5265* (2013.01); *H01L 2251/301* (2013.01)

(58) Field of Classification Search
CPC . H01L 51/5218; H01L 51/56; H01L 27/3206; H01L 27/322; H01L 27/3258; H01L 51/5265; H01L 2251/301; H01L 51/5209; H01L 51/5203; H01L 27/32; H01L 51/5271

See application file for complete search history.

(56) References Cited

U.S. PATENT DOCUMENTS

| | | | |
|---|---|---|---|
| 2018/0123081 A1* | 5/2018 | Baik | H01L 27/3246 |
| 2019/0058022 A1* | 2/2019 | Baik | H01L 51/5278 |
| 2021/0050387 A1* | 2/2021 | Kim | H01L 51/5265 |
| 2021/0408488 A1* | 12/2021 | Lu | H01L 27/3272 |

FOREIGN PATENT DOCUMENTS

KR    10-2015-0038982 A    4/2015

* cited by examiner

*Primary Examiner* — Kevin Quarterman

(74) *Attorney, Agent, or Firm* — Andrew D. Fortney; Central California IP Group, P.C.

(57) ABSTRACT

Provided is an organic light-emitting diode display device (100) in which an anode electrode (134) extends to cover sides of a reflective metal (131) below the anode electrode (134).

13 Claims, 4 Drawing Sheets

ORGANIC LIGHT-EMITTING DIODE DISPLAY DEVICE AND MANUFACTURING METHOD THEREOF

CROSS REFERENCE TO RELATED APPLICATION

The present application claims priority to Korean Patent Application No. 10-2020-0026950, filed Mar. 4, 2020, the entire contents of which is incorporated herein for all purposes by this reference.

BACKGROUND OF THE INVENTION

Field of the Invention

The present disclosure relates to an organic light-emitting diode display device 100. More particularly, the present disclosure relates to an organic light-emitting diode display device 100 having an anode electrode 134 that extends to cover sides of a reflective metal 131 below the anode electrode 134.

Description of the Related Art

Recently, as society has entered the Information Age, the field of displays that visually express electrical signals as information has rapidly developed, and various flat display devices having excellent qualities such as thinness, lightness, low power consumption, etc. have been developed. Specific examples of the flat display devices may include a liquid crystal display (LCD) device, a plasma display panel (PDP) device, a field-emission display (FED) device, an organic light-emitting diode (OLED) display device, etc.

In particular, using self-luminous elements, the organic light-emitting diode display device has a faster response rate, greater luminous efficiency, higher luminance, and a wider viewing angle than other flat display devices. Further, the organic light-emitting diode display device can have a high resolution and be implemented as a large screen, so it has attracted attention as a next-generation display device. In an organic light-emitting diode, an organic emission layer is generally between two electrodes (an anode electrode and a cathode electrode).

Electrons and holes from the two electrodes, respectively, are injected into the organic emission layer so as to generate excitons caused by the combination of the electrons and the holes. Then, light is generated when the generated excitons go from an excited state into a ground state. The organic light-emitting diode applies such a principle.

FIG. 1 is a cross-sectional view of an organic light-emitting diode display device in the related art.

Referring to FIG. 1, an organic light-emitting diode display device 900 in the related art will be described. In the organic light-emitting diode display device 900, a lower insulation film 910 covering a lower metal layer (not numbered) is formed. Further, in each pixel area, a reflective electrode 920 is formed on the lower insulation film 910, a dielectric layer 930 is formed on the reflective electrode 920, and a first electrode 940 is formed on the dielectric layer 930.

Herein, the first electrode 940 is an anode and extends substantially horizontally only on an upper surface of the dielectric layer 930. Thus, sides of the reflective electrode 920 under the dielectric layer 930 are exposed. Herein, with the sides of the reflective electrode 920 exposed, any subsequent ashing process or heat treatment process may cause a defect by corrosion or precipitation of the reflective electrode 920 because the reflective electrode 920 comprises primarily silver and/or aluminum, metals that have a relatively low melting point. Therefore, unfortunately, the degree of reflectivity of the reflective electrode 920 may decrease, and a leakage path between adjacent pixel areas may result.

To solve the problems, the inventors of the present disclosure intend to provide a new organic light-emitting diode display device and a manufacturing method thereof that prevents certain defects from occurring at a reflective electrode during manufacturing.

The foregoing is intended merely to aid in the understanding of the background of the present disclosure, and is not intended to mean that the present disclosure falls within the purview of the related art that is already known to those skilled in the art.

Document of Related Art (Patent Document 1) Korean Patent Application Publication No. 10-2015-0038982, entitled "ORGANIC LIGHT-EMITTING DIODE DISPLAY DEVICE AND MANUFACTURING METHOD THEREOF"

SUMMARY OF THE INVENTION

The present disclosure intends to solve the problems in the related art described above.

The present disclosure is directed to an organic light-emitting diode display device and a manufacturing method thereof, wherein a defect or loss caused by corrosion or precipitation of a reflective electrode that comprises silver and/or aluminum and has a relatively low melting point is prevented from occurring during subsequent etching and heat treatment processes when the reflective electrode is exposed by preforming the subsequent processes with all sides of the reflective electrode covered, so that the degree of reflectivity and luminous efficiency are prevented from decreasing because of the defect or loss of the reflective electrode.

In addition, the present disclosure is directed to an organic light-emitting diode display device and a manufacturing method thereof that blocks a lateral leakage current path between adjacent pixel areas by preventing defects in a reflective electrode so that the current applied to the OLED is maintained or improved, and overall efficiency is maintained or increased.

In addition, the present disclosure is directed to an organic light-emitting diode display device and a manufacturing method thereof in which an anode electrode and trenches in an interlayer insulation film are formed simultaneously, so that an additional process is not required, and manufacturing steps are facilitated.

In addition, the present disclosure is directed to an organic light-emitting diode display device and a manufacturing method thereof in which an anode electrode includes a first part covering an upper surface of a dielectric layer, a second part covering sides of a reflective electrode, and a third part extending from an upper surface of an interlayer insulation film to an upper end of a trench nearby, and additional patterning and etching processes for removing the third part are not required.

The present disclosure may be implemented by one or more embodiments having some or all of the following configurations, to achieve one or more of the above-described objectives.

According to one or more embodiments of the present disclosure, there is provided an organic light-emitting diode display device including: a lower insulation film covering a semiconductor layer; a lower metal layer on the lower insulation film in each pixel area; an interlayer insulation film covering the lower metal layer; a first electrode on the interlayer insulation film in each pixel area; an organic emission layer on the first electrode; and a cathode electrode on the organic emission layer, wherein the first electrode includes a reflective electrode on the interlayer insulation film, a dielectric layer on the reflective electrode, and an anode electrode covering an upper part of the dielectric layer and sidewalls of the reflective electrode.

According to one or more further embodiments of the present disclosure, in the organic light-emitting diode display device, the anode electrode may include: a first substantially horizontal part on the dielectric layer; and a second part extending from ends of the first part to cover each of the sidewalls of the reflective electrode.

According to one or more further embodiments of the present disclosure, in the organic light-emitting diode display device, the interlayer insulation film may comprise a trench therein at each boundary between the pixel areas (e.g., between adjacent ones of the pixel areas), so that leakage current may be prevented from occurring in each of the pixel areas.

According to one or more further embodiments of the present disclosure, in the organic light-emitting diode display device, the anode electrode may further include a third substantially horizontal part extending from the second part to the trench (e.g., from an end of the second part opposite from the first part, to an opening of the nearest one of the trenches).

According to one or more further embodiments of the present disclosure, in the organic light-emitting diode display device, the first electrode may further include a buffer electrode between the interlayer insulation film and the reflective electrode, and the buffer electrode may comprise titanium nitride.

According to one or more other embodiments of the present disclosure, there is provided a manufacturing method of an organic light-emitting diode display device, the method including: forming a lower metal layer in each pixel area on a lower insulation film; depositing an interlayer insulation film on the lower insulation film and the lower metal layer to cover the lower metal layer; forming a buffer electrode, a reflective electrode, and a dielectric layer sequentially on the interlayer insulation film in each pixel area; depositing a first metal or conductive metal nitride on the dielectric layer, exposed sides of the interlayer insulation film, and sidewalls of the reflective electrode; forming the anode electrode by patterning and etching the first metal or conductive metal nitride; forming an organic emission layer on the anode electrode; and depositing a cathode electrode on the organic emission layer.

According to one or more further embodiments of the present disclosure, in the manufacturing method of the organic light-emitting diode display device, forming the anode electrode may form a first substantially horizontal part on the dielectric layer and a second part extending from ends of the first part, covering the sidewalls of the reflective electrode.

According to one or more further embodiments of the present disclosure, in the manufacturing method of the organic light-emitting diode display device, forming the anode electrode may comprise patterning and etching the first metal or conductive metal nitride to simultaneously form the anode electrode and a trench in the interlayer insulation film at each boundary between the pixel areas. The boundary is between adjacent ones of the pixel areas.

According to one or more further embodiments of the present disclosure, in the manufacturing method of the organic light-emitting diode display device, forming the anode electrode may comprise forming a third part extending from the second part to the trench.

According to one or more further embodiments of the present disclosure, in the manufacturing method of the organic light-emitting diode display device, depositing the interlayer insulation film may include: forming a via hole in the interlayer insulation film after depositing the interlayer insulation film, and filling the via hole with a second metal to form a contact electrically connecting the lower metal layer and a first electrode.

According to one or more other embodiments of the present disclosure, there is provided a manufacturing method of an organic light-emitting diode display device, the method including: forming a lower metal layer in each pixel area on a lower insulation film; depositing an interlayer insulation film on the lower insulation film and the lower metal layer to cover the lower metal layer; forming a reflective electrode and a dielectric layer sequentially on the interlayer insulation film in each pixel area; depositing a first metal or conductive metal nitride on the dielectric layer, exposed sides of the interlayer insulation film, and sidewalls of the reflective electrode; forming the anode electrode in each pixel area by patterning and etching the first metal or conductive metal nitride so that the anode electrode extends continuously along an upper surface of the dielectric layer and the sidewalls of the reflective electrode; forming an organic emission layer on the anode electrode; and depositing a cathode electrode on the organic emission layer.

According to one or more further embodiments of the present disclosure, the manufacturing method of the organic light-emitting diode display device may further comprise forming a buffer electrode after forming the reflective electrode and before forming the interlayer insulation film.

According to one or more further embodiments of the present disclosure, in the manufacturing method of the organic light-emitting diode display device, the reflective electrode may comprise silver and/or aluminum.

According to one or more further embodiments of the present disclosure, the manufacturing method of the organic light-emitting diode display device may further include forming a color filter layer on the cathode electrode.

According to one or more other embodiments of the present disclosure, there is provided a manufacturing method of an organic light-emitting diode display device, the method including: forming a lower metal layer in each pixel area on a lower insulation film; depositing an interlayer insulation film on the lower insulation film and the lower metal layer to cover the lower metal layer; forming a reflective electrode and a dielectric layer sequentially on the interlayer insulation film in each pixel area; depositing a first metal or conductive metal nitride on the dielectric layer, exposed sides of the interlayer insulation film, and sidewalls of the reflective electrode; simultaneously forming an anode electrode in each pixel area and a trench in the interlayer insulation film at each boundary between adjacent ones of the pixel areas by a process comprising patterning and etching the first metal or conductive metal nitride, wherein the anode electrode extends continuously along an upper surface of the dielectric layer, the sidewalls of the reflective electrode, and an upper surface of the interlayer insulation film to the trench; forming an organic emission layer on the anode electrode; and depositing a cathode electrode on the organic emission layer.

According to one or more further embodiments of the present disclosure, in the manufacturing method of the organic light-emitting diode display device, depositing the interlayer insulation film may include: forming a via hole in the interlayer insulation film after depositing the interlayer insulation film; and filling the via hole with a second metal.

According to one or more further embodiments of the present disclosure, in the manufacturing method of the organic light-emitting diode display device, the dielectric layers may have heights differing between a red pixel area, a green pixel area, and a blue pixel area.

According to one or more further embodiments of the present disclosure, in the manufacturing method of the organic light-emitting diode display device, a buffer electrode may be positioned between the reflective electrode and the interlayer insulation film.

According to the above embodiments and/or configurations, the present disclosure has the following effects.

According to the present disclosure, in order to prevent a defect or loss caused by corrosion or precipitation of the reflective electrode, which comprises silver and/or aluminum and has a relatively low melting point, during subsequent etching and heat treatment processes when the reflective electrode is exposed, the subsequent processes are performed with all sides of the reflective electrode covered, so that the degree of reflectivity and luminous efficiency (e.g., of the reflective electrode) can be maintained or prevented from decreasing because of the defect in or loss of the reflective electrode.

In addition, according to the present disclosure, a lateral leakage current path between adjacent pixel areas is blocked by preventing the defect in the reflective electrode, so that the current applied to the OLED can be improved and overall efficiency (e.g., of the OLED device) can be increased.

In addition, according to the present disclosure, when patterning is performed to form the anode electrode, trenches are simultaneously formed in the interlayer insulation film so that an additional process is not required and manufacturing steps are facilitated.

In addition, according to the present disclosure, the anode electrode includes a first part covering the upper surface of the dielectric layer, a second part covering sides of the reflective electrode, and a third part extending along the exposed (upper) surface of the interlayer insulation film to a nearby (or nearest) trench, and additional patterning and etching processes for removing the third part are not required.

Meanwhile, effects described in the following specification and provisional effects thereof, which are expected by the technical features of the present disclosure, are considered as effects described in the specification of the present disclosure, even though such effects may not be clearly described herein.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

It is noted that embodiments of the present disclosure may be changed to a variety of different embodiments. The scope of the present disclosure should not be interpreted as being limited to the embodiments described hereinbelow, but may be interpreted on the basis of the appended claims. In addition, the embodiments of the present disclosure are provided for reference in order to fully describe the disclosure for those skilled in the art.

In the following specification, when one element is referred to as being "on", "above", "at a side of", or "at a portion of" another element, the one element may be in contact with the surface of another element, or the one element may be spaced apart from the other element by a predetermined distance. In addition, when one element is spaced apart from another element, a third element may be interposed between the elements. Further, when one element is "directly on" or "directly above" another element, there are no intervening elements between the two elements.

The terms "first", "second", etc. may be used to describe various items, such as various elements, regions and/or parts, but the items are not limited by the terms, and it is noted that a second element is not a first element.

In addition, described hereinbelow is an organic light-emitting diode display device using an organic light-emitting diode on silicon (OLEDoS), which is a result of forming an organic light-emitting diode on a wafer substrate manufactured using a semiconductor process, but it is noted that the scope of the present disclosure is not limited thereto.

Figure 1:
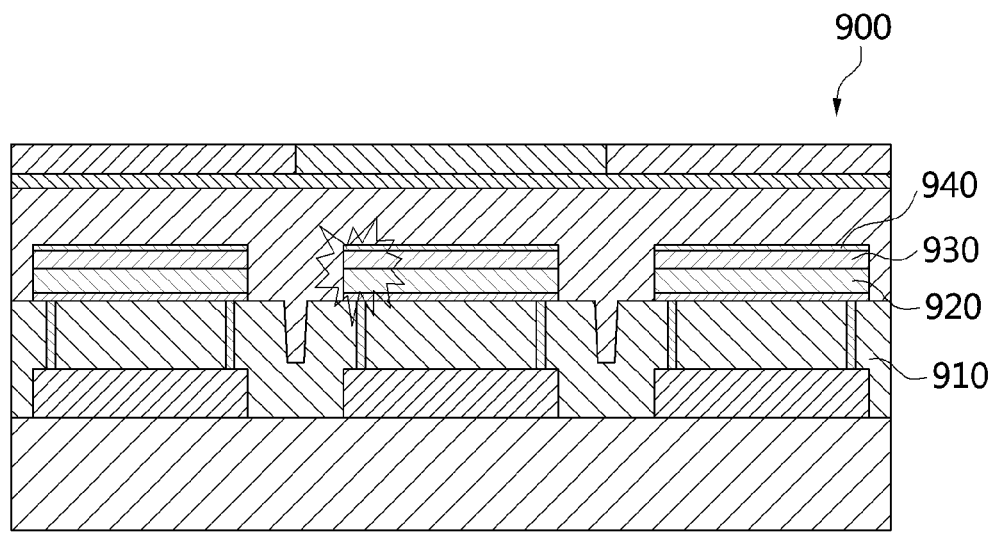
FIG. 1 is a cross-sectional view of an organic light-emitting diode display device in the related art.
Figure 2:
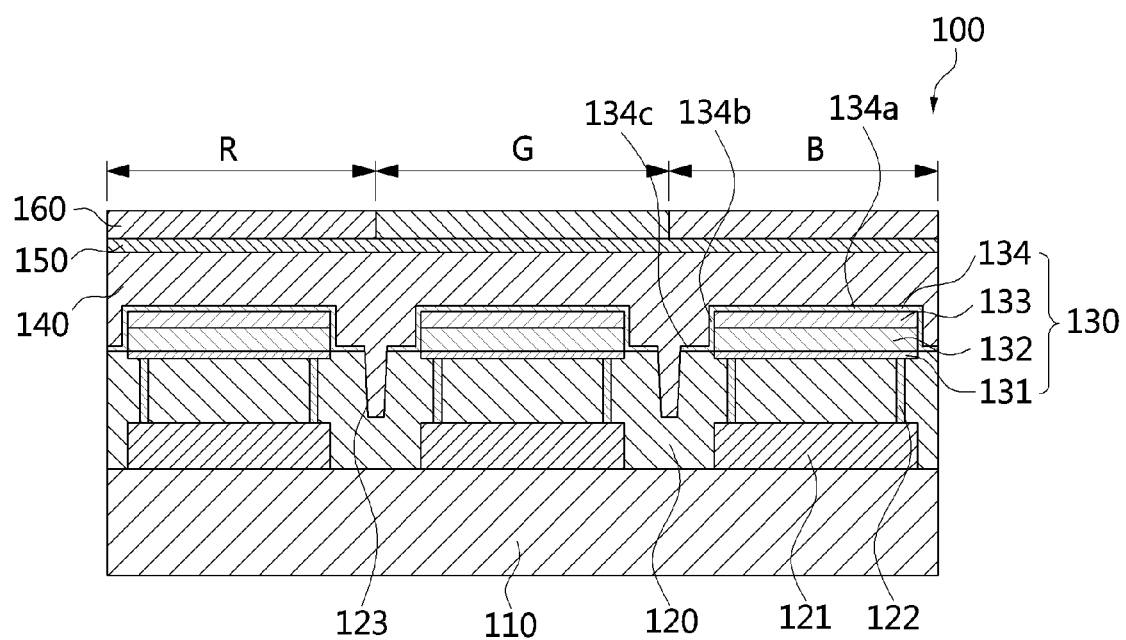
FIG. 2 is a cross-sectional view of an organic light-emitting diode display device according to one or more embodiments of the present disclosure.

FIG. 2 is a cross-sectional view of an organic light-emitting diode display device according to one or more embodiments of the present disclosure.

Hereinafter, an organic light-emitting diode display device according to one or more embodiments of the present disclosure will be described in detail with reference to the accompanying drawings.

Referring to FIG. 2, the present disclosure relates to an organic light-emitting diode display device 100. More specifically, the present disclosure relates to an organic light-emitting diode display device 100 in which an anode electrode 134 extends to cover sides (e.g., sidewalls) of a reflective metal 132 below the anode electrode 134.

First, according to embodiment(s) of the present disclosure, an organic light-emitting diode display device 100 may include multiple pixel areas R, G, and B (for example, a red pixel area R, a green pixel area G, and a blue pixel area B). Specifically, in the organic light-emitting diode display device 100 according to the embodiment(s) of the present disclosure, for example, a lower insulation film 110 is formed on a wafer substrate (not shown). On the wafer substrate, transistor components comprising a source electrode, a drain electrode, a gate electrode, etc. are formed, and such electrodes are insulated by the lower insulation film 110.

The lower insulation film 110 covers a semiconductor layer (not shown). One or more semiconductor layers may be in each of the pixel areas R, G, and B, and may include a source region, a drain region and a gate electrode. Further, the lower insulation film 110 may comprise an inorganic film, for example, a silicon nitride film, a silicon oxide film, or multiple films thereof.

On the lower insulation film 110, a lower metal layer 121 is formed, and on the lower metal layer 121, an interlayer insulation film 120 covering the lower metal layer 121 is formed. Therefore, the lower metal layer 121 is insulated by the interlayer insulation film 120. The interlayer insulation film 120 may comprise an inorganic film, for example, a silicon nitride film, a silicon oxide film, or multiple films thereof.

In addition, in the interlayer insulation film 120, via holes are formed in each of the pixel areas R, G, and B, and contacts 122 fill the via holes. Spaced apart from each other, two or more contacts 122 may be formed in each pixel area, but no limitation thereto is imposed. Further, in the interlayer insulation film 120, a trench 123 may be formed at each boundary between adjacent pixel areas, and it is preferable that the trench 123 be configured to reduce or prevent leakage current from occurring in each of the pixel areas, which will be described later, along each trench 123.

In addition, on the interlayer insulation film 120, one first electrode 130 is in each pixel area. Specifically, the first electrode 130 may be formed by depositing layers for a buffer electrode 131, a reflective electrode 132, a dielectric layer 133, and an anode electrode 134 sequentially (from the lower position to the upper position) and patterning the layers. The buffer electrode 131 is formed on or in the interlayer insulation film 120, and may comprise titanium nitride (TiN) or a multi-layer structure of titanium nitride (TiN) and titanium (Ti), but it is noted that the buffer electrode 131 is not an essential element of the present disclosure.

The reflective electrode 132 may comprise or consist essentially of silver (Ag), which has a high reflectivity for light in a red and a green wavelength range, and/or aluminum (Al), which has a high reflectivity for light in a blue wavelength range, but no limitations thereto are imposed. More specifically, it is preferable that the individual reflective electrode 132 comprises silver in the red pixel areas R and the green pixel areas G, and aluminum in the blue pixel areas B.

The dielectric layer 133 is between the reflective electrode 132 and the anode electrode 134 in each pixel area. Unlike the embodiment shown in FIG. 2, the dielectric layer 133 may have different vertical thicknesses in each different type of pixel area (e.g., R, G or B), considering a fine resonance distance (e.g., of one or more structures in the pixel area). The anode electrodes 134 are horizontally spaced apart from each other above the substrate, and may at least in part define the individual pixel areas. Each transistor on the substrate supplies a predetermined voltage to the anode electrode 134 according to the voltage on a data line when an active gate signal is input on a corresponding gate electrode.

The anode electrode 134 is formed on the dielectric layer 133 and extends along and covers sides (e.g., sidewalls) of the reflective electrode 132 under the dielectric layer 133. For example, the anode electrode 134 may include a first part 134a, a second part 134b, and a third part 134c. The first part 134a extends substantially horizontally on the horizontal dielectric layer 133. The second part 134b extends from ends of the first part 134a and covers sides (sidewalls) of the reflective electrode 132. The third part 134c extends from ends of the second part 134b opposite from those in contact with or joined to the first part 134a to the trench 123. For example, the third part 134c may extend substantially horizontally on the interlayer insulating layer 120, from the first electrode 130 to an opening of a nearby (e.g., the nearest) trench 123 or to a position adjacent thereto.

In the related art, the anode electrode 940 extends substantially horizontally only on the uppermost surface of the dielectric layer 930. Thus, subsequent processes are performed with the sides of the reflective electrode 920 under the dielectric layer 930 exposed. In this way, with the sides of the reflective electrode 920 completely exposed, when a subsequent ashing or heat treatment process is performed, because the reflective electrode 920 contains silver and/or aluminum, a defect caused by corrosion, precipitation, migration, recrystallization, etc. of the reflective electrode 920 may occur. Therefore, unfortunately, the degree of reflectivity of the reflective electrode 920 may decrease, and a leakage path between adjacent pixel areas may result.

In order to solve the problem, in the organic light-emitting diode display device 100 according to embodiment(s) of the present disclosure, the anode electrode 134 includes the first part 134a on the dielectric layer 133 and the second part 134b extending from the first part 134a to completely cover the sides (e.g., sidewalls) of the reflective electrode 132, thereby reducing or preventing defects from occurring in subsequent processes.

In addition, as depicted in FIG. 2, the third part 134c extends from the lower end of the second part 134b to the upper end of the nearby trench 123, although the third part 134c is not an essential element of the present disclosure. However, a separate process is generally performed for removing the third part 134c, so it is preferable not to remove the third part 134c to reduce the number of processing steps.

On the anode electrode 134, an organic emission layer 140 is formed. The organic emission layer 140 may include a hole transporting layer (HTL), a hole injection layer (HIL), an emitting layer (EML), an electron transporting layer (ETL), and an electron injection layer (EIL). When voltage is applied to the anode electrode 134 and a cathode electrode 150 (described later), holes and electrons respectively therefrom move to the emitting layer and combine with each other to emit light. The organic emission layer 140 may be a layer common to all of the pixel areas.

On the organic emission layer 140, the cathode electrode 150 covers the organic emission layer 140. The cathode electrode 150 may be also a common layer formed in the pixel areas.

FIGS. 3 to 9 are cross-sectional views of a manufacturing method of an organic light-emitting diode display device according to embodiment(s) of the present disclosure.

Hereinafter, a manufacturing method of an organic light-emitting diode display device according to embodiment(s) of the present disclosure will be described in detail with reference to the accompanying drawings.

The present disclosure relates to a manufacturing method of an organic light-emitting diode display device. More specifically, the present disclosure relates to a manufacturing method of an organic light-emitting diode display device in which an anode electrode 134 covers sides of a reflective metal 131 below the anode electrode 134.

Figure 3:
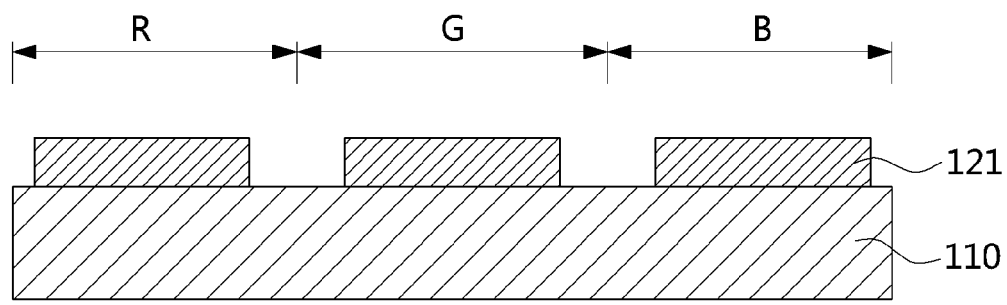
FIGS. 3 to 9 are cross-sectional views of intermediate structures in a manufacturing method of an organic light-emitting diode display device according to one or more embodiments of the present disclosure.

Referring to FIG. 3, first, on a lower insulation film 110, a metal film for forming a lower metal layer 121 is deposited, and the metal layer is patterned and etched to form the lower metal layer 121 in each of the pixel areas. For example, during this process, a part not covered by a photoresist pattern is etched so that the lower metal layer 121 is formed. Then, the photoresist pattern is removed.

Figure 4:
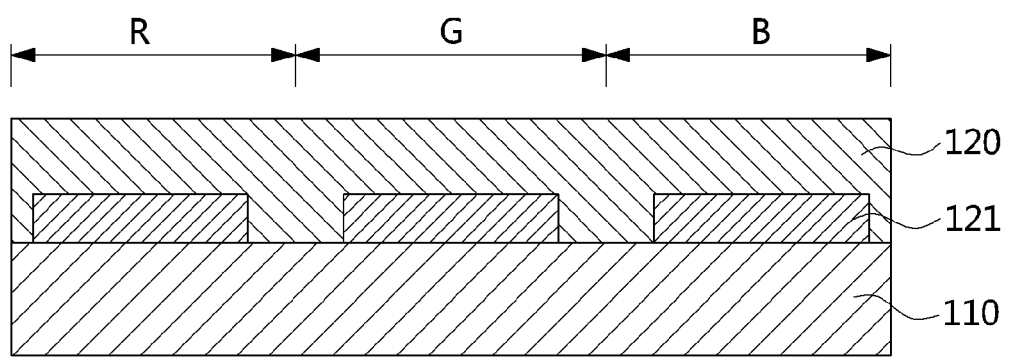

Afterward, referring to FIG. 4, to cover the lower metal layer 121, an interlayer insulation film 120 is deposited on the lower insulation film 110. As described above, the interlayer insulation film 120 may comprise an inorganic film, for example, a silicon nitride film, a silicon oxide film, or multiple films thereof. After depositing the interlayer insulation film 120, an upper surface of the interlayer insulation film 120 is planarized. The planarization process may be or comprise a chemical-mechanical planarization (CMP) process, for example.

Figure 5:
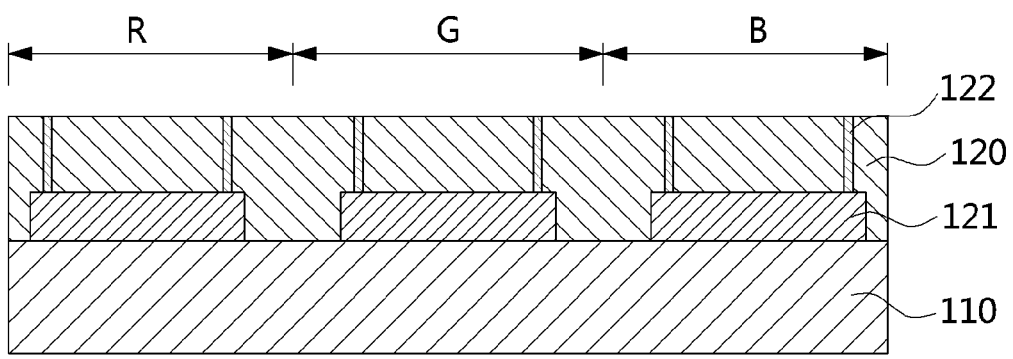

Then, referring to FIG. 5, via holes are formed in the interlayer insulation film 120 in order to electrically connect the lower metal layer 121 to an overlying first electrode 130 in each pixel area. After applying a photoresist pattern, the areas not covered by the photoresist pattern are etched to form the via holes. Afterward, the photoresist pattern is removed. The via holes are filled with, for example, a metal, such as copper, aluminum, or tungsten, and more preferably with tungsten. Excess metal outside the via holes is removed, for example, by CMP or blanket etchback, to form contacts 122.

Figure 6:
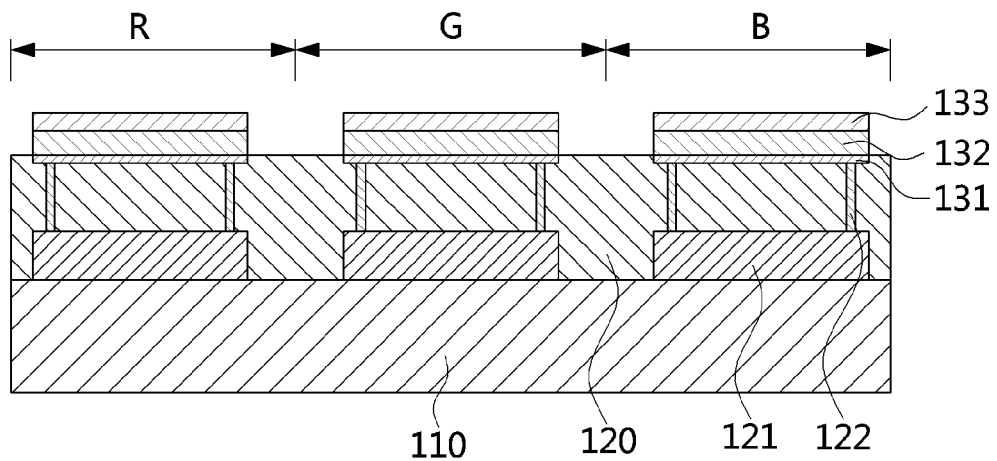

Afterward, referring to FIG. 6, a buffer electrode 131 is formed on the interlayer insulation film 120, a reflective electrode 132 is formed on the buffer electrode 131, and a dielectric layer 133 is formed on the reflective electrode 132. Herein, the buffer electrode 131 may be or comprise titanium nitride or in a multi-layer structure of titanium nitride and titanium. Thus, the buffer electrode 131 may also provide a barrier function, to inhibit or prevent migration of atoms from the underlying layers into an overlying reflective electrode 132. In addition, it is preferable that the reflective electrode 132 comprises silver having a high reflectivity for light in the red and green wavelength ranges in the red pixel areas R and the green pixel areas G, and aluminum having a high reflectivity for light in the blue wavelength range in the blue pixel areas B. However, no limitation thereto is imposed. In addition, as described above, the dielectric layer 133 may have different thicknesses in each of the R, G and B pixel areas.

Accordingly, a metal layer for the buffer electrode 131, a metal layer for the reflective electrode 132, and a layer for the dielectric layer 133 are deposited sequentially. Afterward, the three layers are patterned and etched by conventional patterning and etching processes at boundaries between adjacent pixel areas. For example, after applying a photoresist pattern, the areas not covered by the photoresist pattern are etched. After the etching process is completed, the photoresist pattern is removed.

Figure 7:
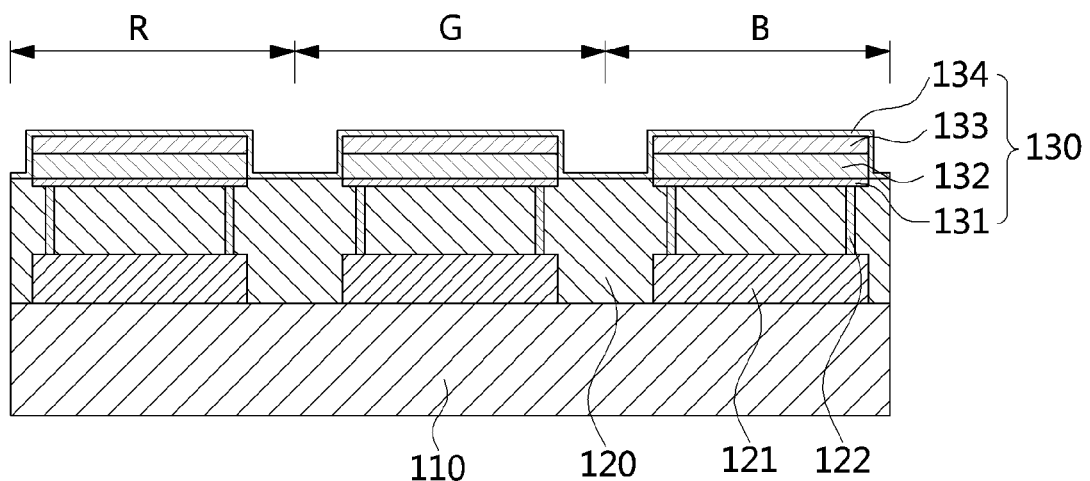

Then, referring to FIG. 7, a metal or conductive metal nitride for the anode electrode 134 is deposited on the dielectric layer 133, the sidewalls of the dielectric layer 133 and the reflective electrode 132, and the upper part of the interlayer insulation film 120. In some embodiments, the buffer electrode 131 is on the planar horizontal uppermost surface of the interlayer insulation film 120. In such embodiments, the metal for the anode electrode 134 may also be deposited on sidewalls of the buffer electrode 131. The metal or conductive metal nitride for the anode electrode 134 may be, for example, titanium nitride (TiN). Herein, the metal or conductive metal nitride is deposited on all of the exposed sides of the dielectric layer 133 and the reflective electrode 132. Therefore, the reflective electrode 132 is covered by the dielectric layer 133 as well as its sidewalls covered by the anode electrode 134, so that all sides of the reflective electrode 132 are covered. Accordingly, when subsequent etching and/or heat treatment processes are performed, the reflective electrode 132 is protected, so that a defect, loss, etc. caused by corrosion, precipitation or other potentially harmful or transformative process on the reflective electrode 920 is prevented from occurring.

Figure 8:
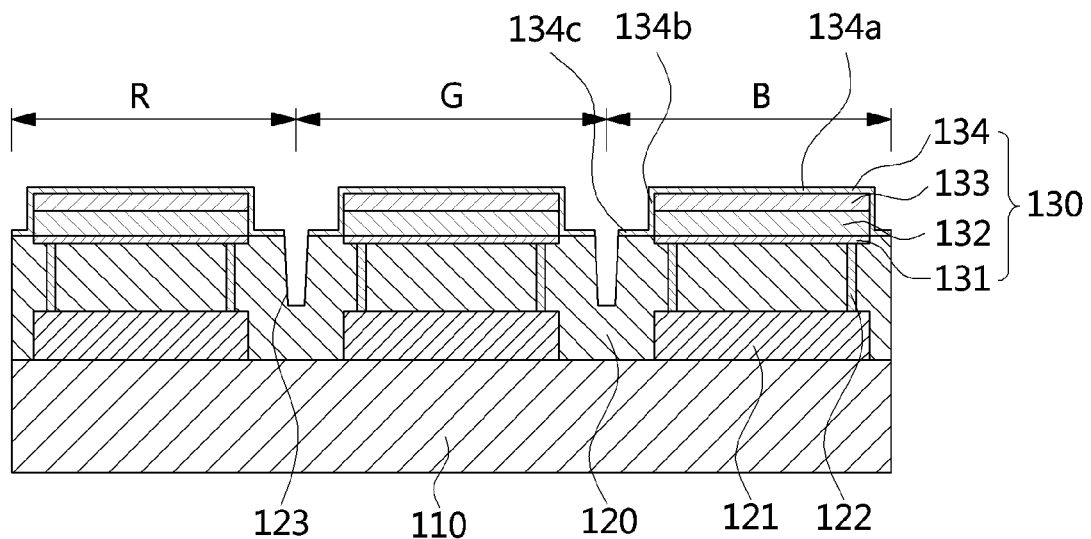

Afterward, referring to FIG. 8, patterning and etching processes are performed on the metal or conductive metal nitride to simultaneously form the anode electrode 134 and trenches 123. Therefore, it is not necessary to perform separate processes for forming the anode electrode 134 and the trenches 123. Specifically, after a photoresist pattern is applied, areas not covered by the photoresist pattern are etched to form the anode electrode 134 in each of the pixel areas, and simultaneously, a trench 123 at each boundary between the pixel areas.

Herein, the anode electrode 134 may include a first part 134a, a second part 134b, and a third part 134c. The first part 134a extends substantially horizontally on the dielectric layer 133. The second part 134b extends from each end of the first part 134a and covers each side of the reflective electrode 132. The third part 134c extends horizontally from an opposite end of the second part 134b to an edge or border of the nearest trench 123.

Figure 9:
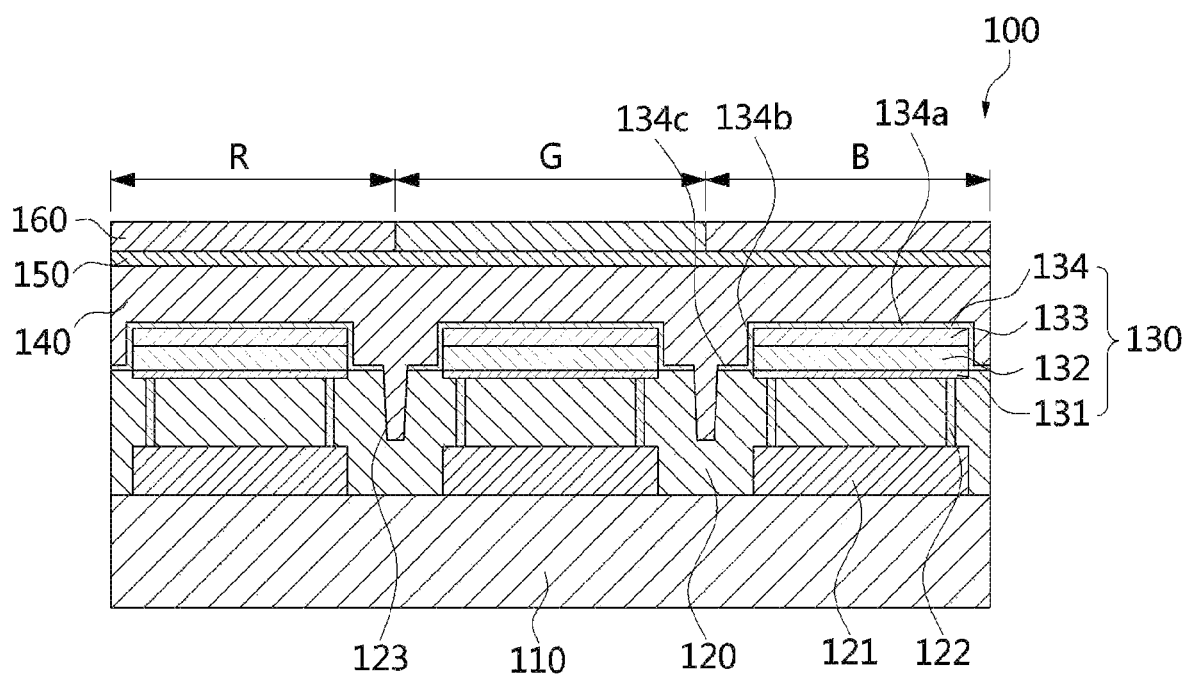

Referring to FIG. 9, after the anode electrode 134 is formed, an organic emission layer 140 is deposited on the anode electrode 134 and in the trenches 123, and a common electrode 150 is deposited on the organic emission layer 140, sequentially. A color filter layer 160 may be formed on the common electrode 150, but is not an essential element of the present disclosure. As described above, the organic emission layer 140 may include a hole transporting layer (HTL), a hole injection layer (HIL), an emitting layer (EML), an electron transporting layer (ETL), and an electron injection layer (EIL) sequentially. When voltage is applied to the anode electrode 134 and the common electrode 150 (described later), holes and electrons respectively therefrom move to the emitting layer and combine with each other to emit light. The organic emission layer 140 may be a layer common to all of the pixel areas.

According to the above-described structure and manufacturing method, defects caused by corrosion, precipitation or other phenomenon of or to the reflective electrode 132 containing silver and/or aluminum during subsequent etching and heat treatment processes when the reflective electrode 132 exposed are prevented from occurring by the anode electrode 134, so that the degree of reflectivity of the reflective electrode 132 itself is maintained. In addition, a lateral leakage current path between adjacent pixel areas may be blocked by preventing the defects in the reflective electrode 132 so that the current applied to the OLED may be maintained or improved, and overall efficiency may be maintained or increased.

In addition, when patterning for forming the anode electrode 134 is performed, the trenches 123 are formed simultaneously, so that processing steps may be reduced or minimized.

The foregoing detailed description illustrates the present disclosure. In addition, the foregoing description illustrates and describes preferred embodiments of the present disclosure, and the present disclosure may be utilized in various other combinations, modifications and environments. That is, it is possible to make changes or modifications within the scope of the concept of the disclosure disclosed herein, within the scope of equivalents to the above described disclosure, and/or within the scope of the skill or knowledge of the art. The above-described embodiments are intended to describe the best mode for carrying out the technical spirit of the present disclosure, and various modifications in the specific applications and uses of the present disclosure are possible. Accordingly, the foregoing detailed description is not intended to limit the present disclosure to the embodiments disclosed.

What is claimed is:

1. A manufacturing method of an organic light-emitting diode display device, the method comprising:
   forming a lower metal layer in each pixel area on a lower insulation film;
   depositing an interlayer insulation film on the lower insulation film and the lower metal layer to cover the lower metal layer;
   forming a buffer electrode, a reflective electrode, and a dielectric layer sequentially on the interlayer insulation film in each pixel area;
   depositing a first metal or conductive metal nitride on the dielectric layer, exposed sides of the interlayer insulation film, and sidewalls of the reflective electrode;
   forming an anode electrode by patterning and etching the first metal or conductive metal nitride;
   forming an organic emission layer on the anode electrode; and
   forming a cathode electrode on the organic emission layer.

2. The method of claim 1, wherein forming the anode electrode forms a first substantially horizontal part on the dielectric layer and a second part extending from ends of the first part, covering the sidewalls of the reflective electrode.

3. The method of claim 2, wherein forming the anode electrode comprises patterning and etching the first metal or conductive metal nitride to simultaneously form the anode electrode and a trench in the interlayer insulation film at each boundary between the pixel areas.

4. The method of claim 3, wherein forming the anode electrode forms a third part extending from the second part to the trench.

5. The method of claim 4, wherein depositing the interlayer insulation film comprises:
   after depositing the interlayer insulation film on the lower insulation film, forming a via hole in the interlayer insulation film; and
   filling the via hole with a second metal to form a contact electrically connecting the lower metal layer and a first electrode.

6. A manufacturing method of an organic light-emitting diode display device, the method comprising:
   forming a lower metal layer in each pixel area on a lower insulation film;
   depositing an interlayer insulation film on the lower insulation film and the lower metal layer to cover the lower metal layer;
   forming a reflective electrode and a dielectric layer sequentially on the interlayer insulation film in each pixel area;
   depositing a first metal or conductive metal nitride on the dielectric layer, on exposed sides of the interlayer insulation film, and sidewalls of the reflective electrode;
   forming the anode electrode in each pixel area by patterning and etching the first metal or conductive metal nitride so that the anode electrode extends continuously along an upper surface of the dielectric layer and the sidewalls of the reflective electrode;
   forming an organic emission layer on the anode electrode; and
   forming a cathode electrode on the organic emission layer.

7. The method of claim 6, further comprising:
   forming a buffer electrode after forming the reflective electrode and before forming the interlayer insulation film.

8. The method of claim 6, wherein the reflective electrode comprises silver and/or aluminum.

9. The method of claim 6, further comprising:
   forming a color filter layer on the cathode electrode.

10. A manufacturing method of an organic light-emitting diode display device, the method comprising:
    forming a lower metal layer in each pixel area on a lower insulation film;
    depositing an interlayer insulation film on the lower insulation film and the lower metal layer to cover the lower metal layers;
    forming a reflective electrode and a dielectric layer sequentially on the interlayer insulation film in each pixel area;
    depositing a first metal or conductive metal nitride on the dielectric layer, exposed sides of the interlayer insulation film, and sidewalls of the reflective electrode;
    simultaneously forming an anode electrode in each pixel area and a trench in the interlayer insulation film at each boundary between adjacent ones of the pixel areas by a process comprising patterning and etching the first metal or conductive metal nitride, wherein the anode electrode extends continuously along an upper surface of the dielectric layer, the sidewalls of the reflective electrode, and an upper surface of the interlayer insulation film to the trench;
    forming an organic emission layer on the anode electrode; and
    forming a cathode electrode on the organic emission layer.

11. The method of claim 10, wherein depositing the interlayer insulation film comprises:
    after depositing the interlayer insulation film, forming a via hole in the interlayer insulation film; and
    filling the via hole with a second metal to form a contact electrically connecting the lower metal layer and a first electrode comprising the reflective electrode.

12. The method of claim 11, wherein the dielectric layer has a different height in a red pixel area, a green pixel area, and a blue pixel area.

13. The method of claim 11, wherein a buffer electrode is between the reflective electrode and the interlayer insulation film.

* * * * *